(12) United States Patent
Kim et al.

(10) Patent No.: US 9,591,744 B2
(45) Date of Patent: Mar. 7, 2017

(54) DISPLAY DEVICE, AND METHOD AND APPARATUS FOR MOUNTING DRIVER IC

(71) Applicants: Joon-Sam Kim, Yongin (KR); Jong-Hwan Kim, Yongin (KR); Sang Won Yeo, Yongin (KR); Sang-Urn Lim, Yongin (KR); Suk-Ho Choi, Yongin (KR)

(72) Inventors: Joon-Sam Kim, Yongin (KR); Jong-Hwan Kim, Yongin (KR); Sang Won Yeo, Yongin (KR); Sang-Urn Lim, Yongin (KR); Suk-Ho Choi, Yongin (KR)

(73) Assignee: SAMSUNG DISPLAY CO., LTD., Yongin, Gyunggi-do (KR)

(*) Notice: Subject to any disclaimer, the term of this patent is extended or adjusted under 35 U.S.C. 154(b) by 513 days.

(21) Appl. No.: 13/711,967

(22) Filed: Dec. 12, 2012

(65) Prior Publication Data

US 2014/0036468 A1 Feb. 6, 2014

(30) Foreign Application Priority Data

Aug. 6, 2012 (KR) ......................... 10-2012-0085998

(51) Int. Cl.
| | |
|---|---|
| *H05K 1/02* | (2006.01) |
| *H05K 13/04* | (2006.01) |
| *G02F 1/1345* | (2006.01) |
| *H05K 3/32* | (2006.01) |
| *H05K 3/34* | (2006.01) |

(52) U.S. Cl.
CPC ....... *H05K 1/0271* (2013.01); *G02F 1/13454* (2013.01); *H05K 3/32* (2013.01); *H05K 13/04* (2013.01); *H05K 3/323* (2013.01); *H05K 3/3494* (2013.01); *H05K 2203/0278* (2013.01); *Y10T 29/41* (2015.01); *Y10T 29/4913* (2015.01); *Y10T 29/53178* (2015.01)

(58) Field of Classification Search
CPC .. G02F 1/13454; H05K 1/0271; H05K 12/04; H05K 3/32
USPC .......................................................... 361/784
See application file for complete search history.

(56) References Cited

U.S. PATENT DOCUMENTS

| | | | |
|---|---|---|---|
| 4,686,565 A * | 8/1987 | Ando | ............................. 348/126 |
| 5,667,129 A * | 9/1997 | Morita | ............... H05K 13/0413 228/102 |
| 5,847,796 A | 12/1998 | Uchiyama et al. | |
| 6,211,938 B1 * | 4/2001 | Mori | ..................... G02F 1/1333 156/109 |
| 6,781,662 B1 | 8/2004 | Uchiyama | |

(Continued)

FOREIGN PATENT DOCUMENTS

| | | |
|---|---|---|
| KR | 10-2005-0001917 A | 1/2005 |
| KR | 10-0485966 B1 | 5/2005 |
| KR | 10-2012-0015256 A | 2/2012 |

*Primary Examiner* — Jenny L Wagner
*Assistant Examiner* — Michael E Moats, Jr.
(74) *Attorney, Agent, or Firm* — Lee & Morse P.C.

(57) ABSTRACT

A display device includes an upper substrate on a lower substrate, a driver integrated chip (IC) on the lower substrate, the driver IC and upper substrate contacting different parts of the lower substrate, a plurality of bumper units along edges of the driver IC, and a deformation preventing bumper unit between the bumper units, the deformation preventing bumper unit being configured to prevent the driver IC from being deformed.

13 Claims, 6 Drawing Sheets

(56) References Cited

U.S. PATENT DOCUMENTS 7,450,393 B2* 11/2008 Hwang et al. ............... 361/760
2012/0018494 A1 1/2012 Jang et al.

* cited by examiner

180
DISPLAY DEVICE, AND METHOD AND APPARATUS FOR MOUNTING DRIVER IC

CROSS-REFERENCE TO RELATED PATENT APPLICATION

This application claims the benefit of priority under 35 U.S.C. §119 to Korean Patent Application No. 10-2012-0085998, filed on Aug. 6, 2012, in the Korean Intellectual Property Office, the disclosure of which is incorporated herein in its entirety by reference.

BACKGROUND OF THE INVENTION

1. Field of the Invention

Example embodiments relate to a method and apparatus, and more particularly, to a display device and a method and apparatus for mounting a driver integrated chip (IC) on the display device.

2. Description of the Related Art

Display devices are devices used to provide visual information, e.g., images, to users. The display devices are manufactured in various forms to express the visual information. In particular, a display device may include a display panel that displays images to provide visual information to a user, and a driver integrated chip (IC) that applies a signal for controlling the display panel.

The driver IC is generally installed in the display panel by being adhered to the display panel. The display device may be smoothly driven according to how accurately the driver IC is mounted on the display panel. For example, when the driver IC is not accurately mounted on the display panel, the display device needs to be replaced or repaired due to an operational problem of the display device.

SUMMARY OF THE INVENTION

Example embodiments provide a display device smoothly and stably connected to a driver IC by minimizing deformation of the driver IC, and a method and apparatus for mounting the driver IC.

According to an aspect of the example embodiments, there is provided a display device including an upper substrate on a lower substrate, a driver integrated chip (IC) on the lower substrate, the driver IC and upper substrate contacting different parts of the lower substrate, a plurality of bumper units along edges of the driver IC; and a deformation preventing bumper unit between the bumper units, the deformation preventing bumper unit being configured to prevent the driver IC from being deformed.

The deformation preventing bumper unit may include a bumper on the driver IC, and a conductive ball on the bumper.

The plurality of bumper units may be between the driver IC and the lower substrate, the bumper units extending only along edges of the driver IC.

The deformation preventing bumper unit may be between the driver IC and the lower substrate and parallel to the plurality of bumper units, the deformation preventing bumper unit being centered between two outer edges of the driver IC.

Each bumper unit may be spaced apart from an adjacent bumper unit and from the deformation preventing bumper unit along a lengthwise direction of the lower substrate, the driver IC being connected to the lower substrate via the plurality of bumper units and deformation preventing bumper unit.

According to another aspect of the example embodiments, there is also provided a driver IC mounting apparatus, including a first stage configured to support a display panel, a second stage configured to support the display panel, the second stage being movable to adjust a distance between the first stage and the second stage, and a jig spaced apart from the second stage by a predetermined interval, the jig being configured to apply pressure to a driver IC to be mounted on the display panel.

The driver IC mounting apparatus may further include a buffering member in the jig.

The second stage may include a protruding portion protruding toward the display panel, the driver IC being mounted on a portion of the display panel overlapping the protruding portion of the second stage.

An outermost edge of the second stage may be aligned with an inner side of an outermost bumper unit of the driver IC.

According to yet another aspect of the example embodiments, there is also provided a driver IC mounting method, including forming a display panel on a first stage and a second stage, moving the second stage to adjust a distance between the first and second stages, mounting a driver IC on the display panel, and applying pressure to the driver IC by using a jig.

Mounting of the driver IC may be preformed before moving the second stage, and moving the second stage includes aligning an outer edge of the second stage with an inner side of an outermost bumper unit of the driver IC in a lengthwise direction of the driver IC.

Forming the display panel may include forming a thin film transistor on a lower substrate, forming a color filter on an upper substrate, adhering the upper substrate to a part of the lower substrate, such that the driver IC and the upper substrates are on different parts of the lower substrate, and forming a plurality of bumper units at ends of the driver IC.

Forming the display panel may further include forming a deformation preventing bumper unit between the bumper units, the deformation preventing bumper unit being configured to prevent the driver IC from being deformed.

Forming the deformation preventing bumper unit may include forming a bumper on the driver IC, and forming a conductive ball on the bumper.

Applying pressure to the driver IC may include applying pressure using by a jig through a buffering member, the buffering member being positioned between the jig and the driver IC.

Mounting the driver IC on the display panel may include mounting the driver IC on a portion of the display panel that overlaps a protrusion of the second stage, the protrusion of the second stage protruding from an upper surface of the second stage toward the display panel.

BRIEF DESCRIPTION OF THE DRAWINGS

The above and other features and advantages ill become more apparent by describing in detail exemplary embodiment with reference to the attached drawings, in which.

DETAILED DESCRIPTION OF THE INVENTION

Hereinafter, the inventive concept will be described more fully with reference to the accompanying drawings, in which exemplary embodiments are shown. The inventive concept may, however, be embodied in many different forms and should not be construed as limited to the exemplary embodiments set forth herein. Rather, these embodiments are provided so that this disclosure will be thorough and complete, and will fully convey the scope of the invention to those of ordinary skilled in the art.

The terminology used herein is for the purpose of describing particular embodiments only and is not intended to be limiting of the inventive concept. As used herein, the singular forms 'a', 'an', and 'the' are intended to include the plural forms as well, unless the context clearly indicates otherwise. It will be further understood that the terms "comprises' and/or 'comprising,' when used in this specification, specify the presence of stated features, integers, operations, elements, and/or components, but do not preclude the presence or addition of one or more other features, integers, operations, elements, components, and/or groups thereof. It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Expressions such as "at least one of," when preceding a list of elements, modify the entire list of elements and do not modify the individual elements of the list.

Figure 1:
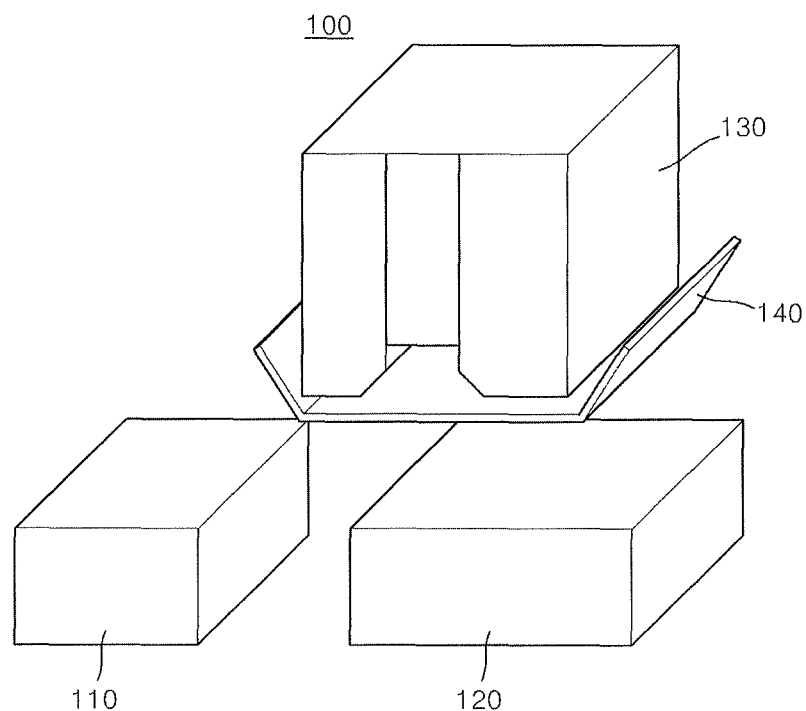
FIG. 1 is a conceptual diagram showing a driver IC mounting apparatus according to an embodiment.
Figure 2:
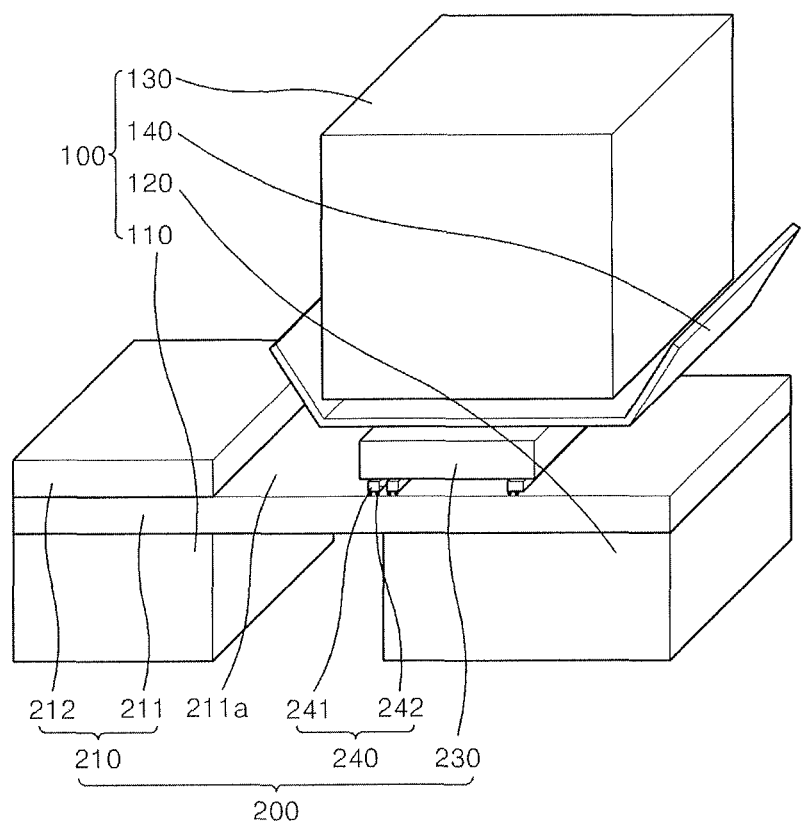
FIG. 2 is a conceptual diagram for describing a method of mounting a driver IC on a display panel by using the driver IC mounting apparatus shown in FIG. 1.
Figure 3A:
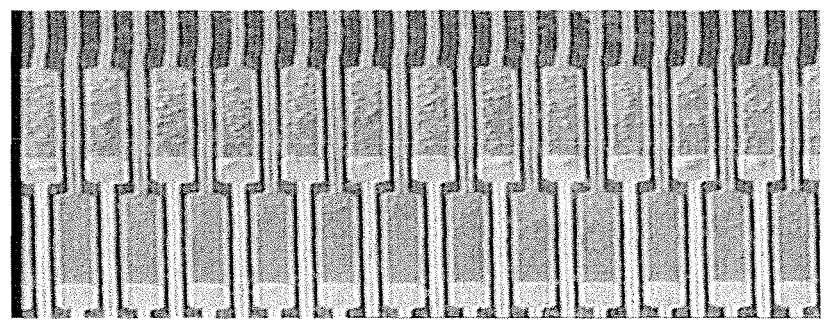
FIGS. 3A and 3B are images showing results of comparison between the driver IC and the display panel after the driver IC is mounted on the display panel by using the driver IC mounting apparatus shown in FIG. 1.
Figure 3B:
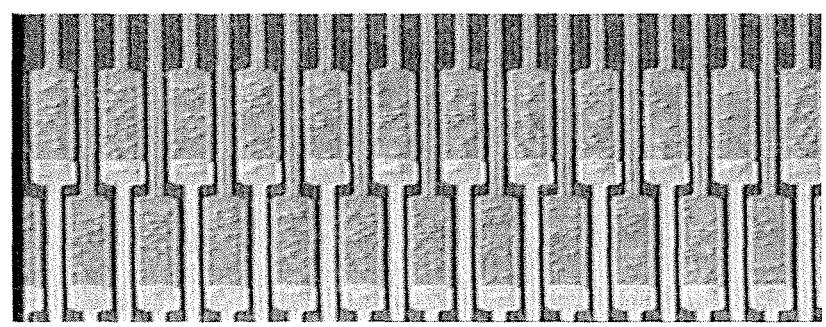

FIG. 1 is a conceptual diagram showing a driver IC mounting apparatus 100 according to an embodiment, and FIG. 2 is a conceptual diagram for describing a method of mounting a driver IC 230 on a display panel 210 by using the driver IC mounting apparatus 100. FIGS. 3A and 3B are images showing results of comparison between the driver IC 230 and the display panel 210 after the driver IC 230 is mounted on the display panel 210 by using the driver IC mounting apparatus 100.

Referring to FIGS. 1 and 2, the driver IC mounting apparatus 100 may include a first stage 110 for supporting the display panel 210. The first stage 110 may move in horizontal and vertical directions.

The driver IC mounting apparatus 100 may further include a second stage 120 installed to move in a similar way to the first stage 110. In this regard, the second stage 120 may support a part of the display panel 210 in a similar way to the first stage 110. The second stage 120 may be installed at a predetermined distance from the first stage 110, and the predetermined distance between the second stage 120 and the first stage 110 may vary. The predetermined distance between the second stage 120 and the first stage 110 may be adjusted according to the location of the driver IC 230 installed on the display panel 210.

The driver IC mounting apparatus 100 may further include a jig 130 that is disposed to be spaced apart from the second stage 120 by a predetermined interval. In this regard, the jig 130 may be installed to move in a vertical direction and may apply pressure to the driver IC 230 mounted on the display panel 210.

Also, the driver IC mounting apparatus 100 may include a buffering member 140 disposed on the jig 130. Here, the buffering member 140 may contact the driver IC 230 and apply force to the driver IC 230 when mounting the driver IC 230. In particular, the buffering member 140 may be between the jig 130 and the driver IC 230 to prevent excessive force from being transferred to the driver IC 230 by absorbing force of the jig 130 while transferring the force of the jig 130 to the driver IC 230.

As illustrated in FIG. 2, the display panel 210 may be first disposed on the first stage 110 and the second stage 120. Here, the first stage 110 and the second stage 120 may be disposed to be spaced apart from each other by the predetermined distance.

Then, the driver IC 230 may be disposed on a part of the display panel 210. Here, after the driver IC 230 is disposed, the position of at least one of the first stage 110 and second stage 120 may be adjusted to correspond to the position of the driver IC 230.

For example, the second stage 120 may be moved to be disposed below a bumper unit 240 formed on the driver IC 230. When the driver IC 230 includes a plurality of the bumper unit units 240, as illustrated in FIG. 2, the second stage 120 may be moved to have one end at an inner side of the outermost bumper unit 240 in a lengthwise direction of the lower substrate 211. In other words, an outermost edge of the second stage 120 may be positioned at, e.g., to be aligned with, an inner side of the outermost bumper unit 240, e.g., so the outermost bumper unit 240 does not overlap the second stage 120.

In another example, the first stage 110 and the second stage 120 may be spaced apart from each other by the predetermined distance, followed by positioning the driver IC 230 on the display panel 210 to have an outermost edge of the second stage 120 positioned at the inner side of the outermost bumper unit 240. In yet another example, the distance between the first stage 110 and the second stage 120 may be uniformly determined according to a size, a type, etc. of a product, e.g., according to the location of the driver IC 230 mounted on the display panel 210.

When the driver IC 230 is disposed as described above, the driver IC 230 may be pressed via the jig 130. Here, the buffering member 140 installed in the jig 130 applies pressure to the driver IC 230.

In detail, when the buffering member 140 applies pressure to the driver IC 230, the buffering member 140 applies force that installs the driver IC 230 on the display panel 210 via the bumper units 240. It is noted that the plurality of bumper unit units 240 may be installed outside of the driver IC 230, e.g., on an outer surface of the driver IC 230 facing away from the buffering member 140.

In detail, each bumper unit 240 may include a plurality of conductive balls 242. For example, the conductive balls 242 may be mounted on the display panel 210 by pressure application via the jig 130. That is, the jig 130 maybe used to apply pressure via the buffer member 140 and the driver IC 230 to the conductive balls 242, e.g., conductive particles of an anisotropic conductive film (ACF), so each of the conductive balls 242 may melt due to heat generated by the pressure and may be adhered to the display panel 210. As such, the driver IC 230 may be connected to the display panel 210 via the melted conductive balls 242. Once the above-described operation is finished, the force applied to the jig 130 may be removed, and a display device 200 with the drive IC 230 attached thereto may be removed.

As further illustrated in FIG. 2, the display device 200 manufactured in the above-described manner may include a lower substrate 211 with a thin film transistor. The lower substrate 211 may include a pad unit 211a formed by physically forming a part of the thin film transistor to the outside. Also, the display device 200 may include a color filter, and may include an upper substrate 212 adhered to a part of the lower substrate 211. Here, the upper substrate 212 and the lower substrate 211 have a general configuration, and thus a detailed description thereof is omitted.

The display device 200 may include the driver IC 230 installed on a part of the lower substrate 211 to which the upper substrate 212 is not adhered. In detail, the driver IC 230 may be installed on the pad unit 211a. In other words, the upper substrate 212 and the driver IC 230 may be on, e.g., completely, different parts of the lower substrate 211, e.g., to be spaced apart from each other along the lengthwise direction of the lower substrate 211.

The display device 200 may include the plurality of bumper units 240 formed on the driver IC 230. Here, the bumper units 240 may be installed on an outer circumferential region of the driver IC 230 as described above. Also, each of the bumper units 240 may include a bumper 241 installed on the driver IC 230 and the conductive balls 242 installed on the bumper 241.

In the display device 200 manufactured through the above-described process, i.e., via the bumper units 240, contact between the driver IC 230 and the display panel 210 may be uniformly performed. Further, deformation of the driver IC 230 may be prevented or substantially minimized.

In contrast, when a display panel and a driver IC are conventional connected to each other, the driver IC may be deformed due to pressure applied between the display panel and the driver IC and heat generated during the pressing. In particular, when a jig applies pressure to a driver IC directly on a display panel, e.g., without alignment relative to bumper units and support stages, the driver IC may bend in a direction of a gravitational force, e.g., a portion of the driver IC may bend in the direction of a gravitational force due to stress concentrating on a portion of one end of the supporting stage. Further, an opposite end of the driver IC may shift in a direction opposite to the direction of the gravitational force due to force of the jig.

However, according to example embodiments, when the second stage 120 is disposed relative to the bumper units 240 and then pressed, concentration of stress and bending of the driver IC 230 may be even distributed, and therefore, substantially minimized. Accordingly, force may be uniformly transferred to the bumper unit 240 installed on the driver IC 230. Also, if the force is uniformly transferred to the bumper unit 240 installed on the driver IC 230, the outermost bumper unit 240 may uniformly contact the pad unit 211a.

For example, as illustrated in FIG. 3A, when the position of an outermost bumper unit 240 is different from the above-described case, the contact between the bumper unit and pad unit is non-uniform (see row of contacts without bumps in FIG. 3A). In another example, as illustrated in FIG. 3B, when the outermost bumper unit 240 is disposed and pressed according to example embodiments on the pad unit 211a, the conductive balls 242 formed on the outermost bumper unit 240 may uniformly and conjunctly contact the pad unit 211a.

In FIGS. 3A and 3B experimental conditions are as follows: a temperature of about 220° C.±5° C., and weight applied via the jig 130 is about 70 Mpa. Also, a thickness and a width of a short side of the driver IC 230 are about 0.25 mm and about 1.72 mm, respectively, and a thickness of the buffering member 140 is about 0.1 mm.

Accordingly, in the display device 200 formed by using the driver IC mounting apparatus 100 and the driver IC mounting method, since the driver IC 230 may uniformly and conjunctly contact the pad unit 211a, a manufacturing failure rate may be minimized, and product reliability may be achieved. Also, the driver IC mounting apparatus 100 and the driver IC mounting method may improve a contact performance between the driver IC 230 and the display panel 210, and thus malfunction of the display device 200 may be prevented.

Figure 4:
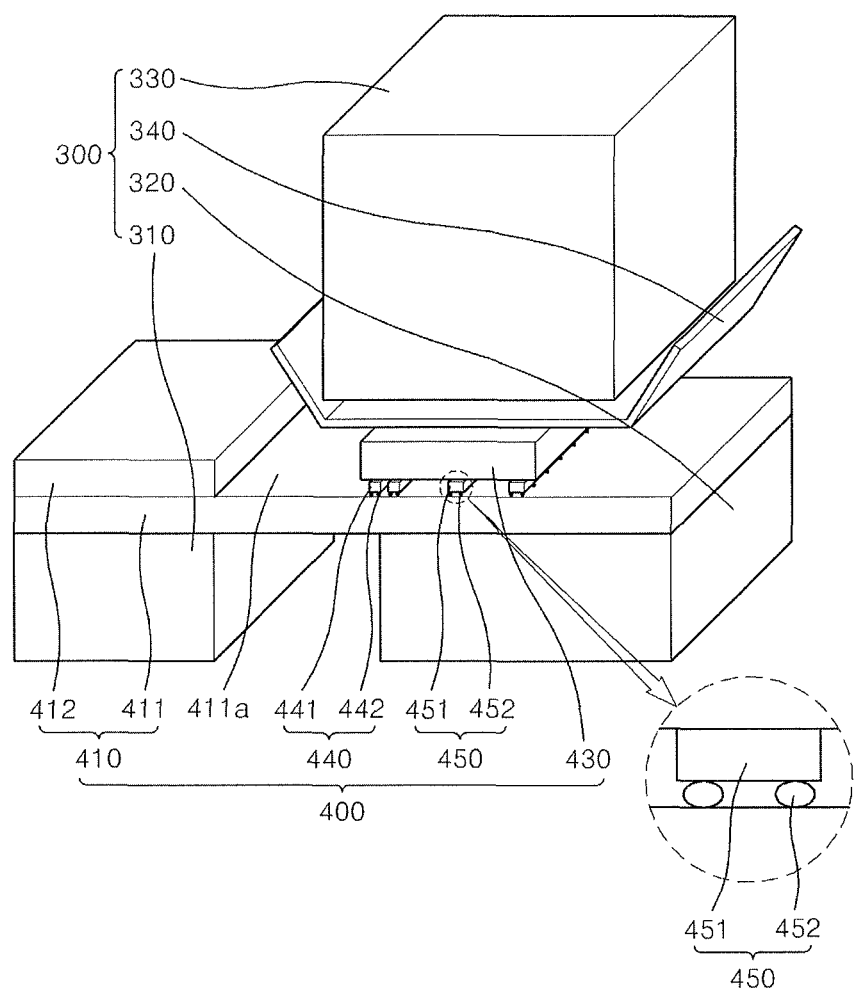
FIG. 4 is a conceptual diagram showing a driver IC mounting apparatus according to another embodiment.
Figure 5:
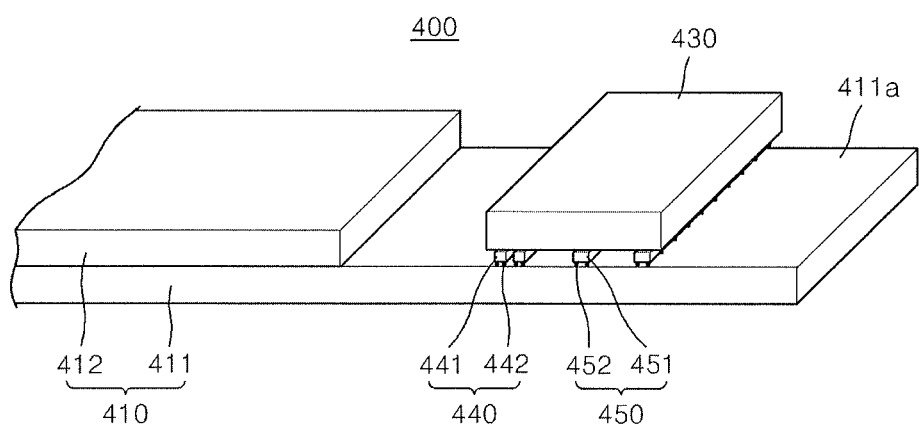
FIG. 5 is a conceptual diagram showing a display device manufactured by using the driver IC mounting apparatus shown in FIG. 4.

FIG. 4 is a conceptual diagram showing a driver IC mounting apparatus 300 according to another embodiment. FIG. 5 is a conceptual diagram showing a display device 400 manufactured by using the driver IC mounting apparatus 300.

Referring to FIGS. 4 and 5, the driver IC mounting apparatus 300 may include a first stage 310, a second stage 320, a jig 330, and a buffering member 340. Here, the first stage 310, the second stage 320, the jig 330, and the buffering member 340 are configured in the same way as those described above, and thus a detailed description thereof is omitted.

A method of manufacturing the display device 400 by using the driver IC mounting apparatus 300 may be performed in the similar way to that described above. In detail, a display panel 410 may be disposed on the first stage 310 and the second stage 320. Then, after the driver IC 430 is disposed on the display panel 410, the driver IC 430 may be pressed by the jig 330 and the buffering member 340 so as to be mounted on the display panel 410.

The display device 400 formed by using the above-method may include an upper substrate 412 and a lower substrate 411. The lower substrate 411 may include a thin film transistor (not shown) and a pad unit 411a. The upper substrate 412 may include a color filter (not shown). Here, the upper substrate 412 and the lower substrate 411 are configured in a similar way to that described above, and thus a detailed description thereof is omitted.

Also, the display device 400 may include the driver IC 430 and a plurality of bumper units 440. Here, the driver IC 430 and the plurality of bumper units 440 have the same characteristics as those described above, and thus a detailed description thereof is omitted.

The display device 400 may further include a deformation preventing bumper unit 450 installed on the driver IC 430. Here, the deformation preventing bumper unit 450 may include a deformation preventing bumper 451 installed on the driver IC 430 and a deformation preventing conductive ball 452 installed on the deformation preventing bumper unit 450. The deformation preventing bumper unit 450 may be between the plurality of bumper units 440.

When the driver IC 430 is installed according to example embodiments, deformation of a central portion of the driver IC 430 may be prevented due to support of the deformation preventing bumper unit 450. In detail, the deformation preventing bumper unit 450 may be installed on the central portion of the driver IC 430 to support the driver IC 430. In particular, the deformation preventing bumper unit 450 may minimize an extent the driver IC 430 bends.

Accordingly, in the display device 400 formed by using the driver IC mounting apparatus 300 and the driver IC mounting method, since the driver IC 430 may uniformly and conjunctly contact the pad unit 411a, a manufacturing failure rate may be minimized and product reliability may be achieved. Also, the driver IC mounting apparatus 300 and the driver IC mounting method may improve a contact performance between the driver IC 430 and the display panel 410, and thus malfunction of the display device 400 may be prevented.

In particular, if the display device 400 is manufactured by using the above-described method, deformation of the driver IC 430 may be minimized, and thus malfunction of the display device 400 may be prevented, and the driver IC 430 may be prevented from being separated.

Figure 6:
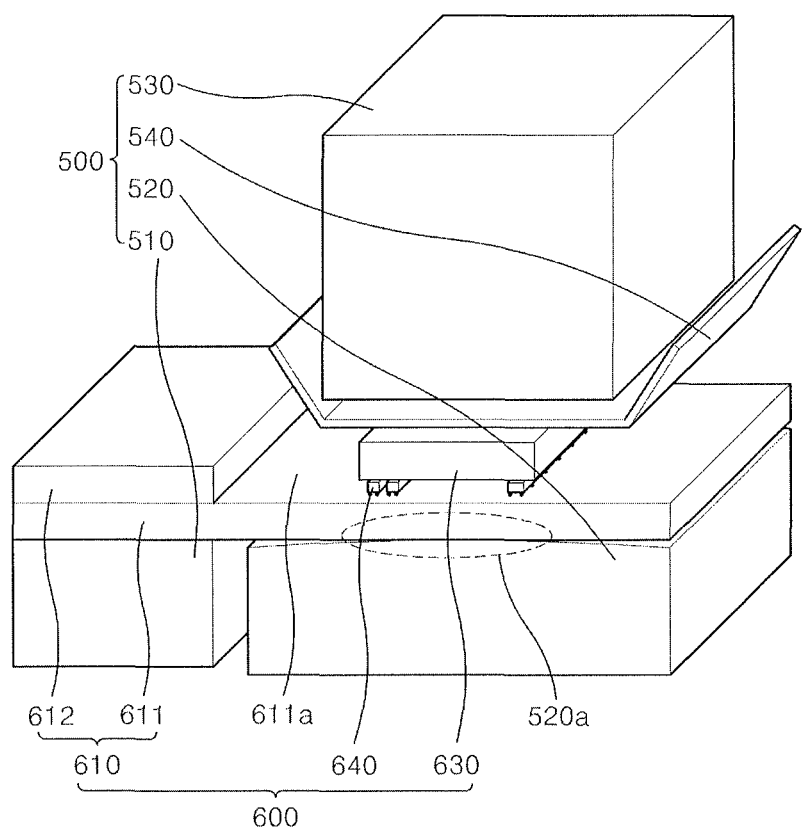
FIG. 6 is a conceptual diagram showing a driver IC mounting apparatus according to another embodiment.

FIG. 6 is a conceptual diagram showing a driver IC mounting apparatus 500 according to another embodiment.

Referring to FIG. 6, the driver IC mounting apparatus 500 may include a first stage 510, a second stage 520, a jig 530, and a buffering member 540. Here, the first stage 510, the jig 530, and the buffering member 540 may be formed in the same way as or in a similar way to those described above.

The second stage 520 may include a protruding portion 520*a* (circled by perforated line in FIG. 6) that protrudes toward a display panel 610. In detail, an upper surface of the second stage 520, i.e., a surface facing the display panel 610, may be non-flat and may be formed to protrude toward a lower substrate 611 of the display panel. In particular, the second stage 520 may have an irregular shape, so a center of the upper surface of the second stage 520 may protrude upward. As such, a driver IC 630 may be mounted on a portion of the lower substrate 611 that overlaps the protruding portion 520*a* of the second stage 520, i.e., the driver IC 620 overlaps the protruding portion 520*a*. Here, the driver IC mounting apparatus 500 may prevent the driver IC 630 from being deformed due to the second stage 520 when the driver IC 630 is mounted on the lower substrate 611.

In detail, the display panel 610 may be mounted on the first stage 510 and the second stage 520, and the driver IC 630 may be disposed on the display panel 610 mounted on the first stage 510 and the second stage 520. When the driver IC 630 is pressed via the jig 530 and the buffering member 540 according to example embodiments, the driver IC 630 may be adhered to the display panel 610 without deformation. That is, a bumper unit 640 installed on the driver IC 630 may move toward the second stage 520 centering around the protruding portion 520*a*.

In particular, when the bumper unit 640 moves, the driver IC 630 may bend in a direction opposite to the direction of a gravitational force of the driver IC 630. Here, in the driver IC 630, bending occurring in a direction of a gravitational force and bending occurring in a direction opposite to the direction of a gravitational force offset each other, i.e., occur in parallel.

As described above, force is applied to the driver IC 630 in accordance with movement of the jig 530, and force may be uniformly applied to the bumper unit 640 formed on an outer circumferential region of the driver IC 630. Here, the bumper unit 640 may be uniformly adhered to the display panel 610 by the force uniformly applied to the bumper unit 640.

Accordingly, in the display device 600 formed by using the driver IC mounting apparatus 500 and the driver IC mounting method, since the driver IC 630 may uniformly and conjunctly contact a pad unit 611*a*, a manufacturing failure rate may be minimized and product reliability may be achieved. Also, the driver IC mounting apparatus 500 and the driver IC mounting method may improve a contact performance between the driver 630 and the display panel 610, and thus malfunction of the display device 600 may be prevented.

By way of summary and review, according to one or more embodiments, since a driver IC may uniformly and conjunctly contact a pad unit, a manufacturing failure rate may be minimized, and product reliability may be achieved. Also, a contact performance between the driver and the display panel may be improved, and thus malfunction of the display device may be prevented. In particular, deformation of the driver IC may be minimized, and thus malfunction of the display device may be prevented, and the driver IC may be prevented from being separated.

While the example embodiments has been particularly shown and described with reference to exemplary embodiments thereof, it will be understood by those of ordinary skill in the art that various changes in form and details may be made therein without departing from the spirit and scope of the example embodiments as defined by the following claims.

What is claimed is:

1. A driver integrated chip (IC) mounting apparatus, comprising:
    a first stage to support a display panel;
    a second stage to support the display panel, the second stage being movable to adjust a distance in a horizontal direction between the first stage and the second stage; and
    a jig spaced apart from the second stage in a vertical direction by a predetermined interval, the jig to apply pressure to a driver IC in the vertical direction to be mounted on the display panel, wherein
    the display panel is to be supported on top surfaces of the first and second stages.

2. The driver IC mounting apparatus of claim 1, further comprising a buffering member on the jig.

3. The driver IC mounting apparatus of claim 1, wherein the second stage includes a protruding portion protruding toward the display panel, the driver IC being mounted on a portion of the display panel overlapping the protruding portion of the second stage.

4. The driver IC mounting apparatus of claim 1, wherein an outermost edge of the second stage is aligned with an inner side of an outermost bumper unit of the driver IC.

5. A driver integrated chip (IC) mounting method, comprising:
    providing a display panel on top surfaces of first and second stages;
    moving the second stage to adjust a distance in a horizontal direction between the first and second stages;
    mounting a driver IC on the display panel; and
    applying pressure to the driver IC in a vertical direction by using a jig spaced apart from the second stage in the vertical direction by a predetermined interval.

6. The method of claim 5, wherein:
    mounting of the driver IC is preformed before moving the second stage, and
    moving the second stage includes aligning an outer edge of the second stage with an inner side of an outermost bumper unit of the driver IC in a lengthwise direction of the driver IC.

7. The method of claim 5, wherein forming the display panel includes:
    forming a thin film transistor on a lower substrate;
    forming a color filter on an upper substrate;
    adhering the upper substrate to a part of the lower substrate, such that the driver IC and the upper substrates are on different parts of the lower substrate; and
    forming a plurality of bumper units at ends of the driver IC.

8. The method of claim 7, wherein forming the display panel further comprises forming a deformation preventing bumper unit between the bumper units, the deformation preventing bumper unit to prevent the driver IC from being deformed.

9. The method of claim 8, wherein forming the deformation preventing bumper unit includes forming a bumper on the driver IC, and forming a conductive ball on the bumper.

10. The method of claim 5, wherein applying pressure to the driver IC includes applying pressure using by a jig through a buffering member, the buffering member being positioned between the jig and the driver IC.

11. The method of claim 5, wherein mounting the driver IC on the display panel includes mounting the driver IC on a portion of the display panel that overlaps a protrusion of the second stage, the protrusion of the second stage protruding from an upper surface of the second stage toward the display panel.

12. The driver IC mounting apparatus of claim 1, wherein the jig does not overlap the first stage.

13. The driver IC mounting apparatus of claim 1, wherein the display panel is between the second stage and the jig.

* * * * *